(12) United States Patent
Kirchhoff

(10) Patent No.: US 6,759,323 B2
(45) Date of Patent: Jul. 6, 2004

(54) METHOD FOR FILLING DEPRESSIONS IN A SURFACE OF A SEMICONDUCTOR STRUCTURE, AND A SEMICONDUCTOR STRUCTURE FILLED IN THIS WAY

(75) Inventor: Markus Kirchhoff, Ottendorf-Okrilla (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/793,345

(22) Filed: Feb. 26, 2001

(65) Prior Publication Data
US 2001/0054749 A1 Dec. 27, 2001

(30) Foreign Application Priority Data
Feb. 25, 2000 (DE) .......................................... 100 10 286

(51) Int. Cl.⁷ ...................... H01L 21/4763; H01L 21/44
(52) U.S. Cl. ...................... 438/627; 438/626; 438/631; 438/653
(58) Field of Search ................................ 438/626, 627, 438/624, 631, 643, 645, 653, 927; 257/751, 752, 760

(56) References Cited

U.S. PATENT DOCUMENTS

| | | | |
|---|---|---|---|
| 5,013,691 A | * 5/1991 | Lory et al. .................. | 438/789 |
| 5,821,621 A | 10/1998 | Jeng ........................... | 257/759 |
| 5,858,848 A | 1/1999 | Gardner et al. ............. | 438/305 |
| 6,004,841 A | * 12/1999 | Chang et al. ................ | 438/238 |
| 6,028,013 A | 2/2000 | Annapragada et al. ...... | 438/783 |
| 6,100,202 A | * 8/2000 | Lin et al. .................... | 438/734 |
| 6,180,530 B1 | * 1/2001 | Liaw et al. ................. | 438/706 |
| 6,203,863 B1 | * 3/2001 | Liu et al. .................... | 427/579 |

FOREIGN PATENT DOCUMENTS

| | | |
|---|---|---|
| DE | 44 30 120 A1 | 3/1995 |
| DE | 195 05 268 C2 | 8/1996 |
| EP | 0 664 560 A2 | 7/1995 |
| WO | WO 98/58406 | 12/1998 |
| WO | WO 98/59366 | 12/1998 |

* cited by examiner

Primary Examiner—Hung Vu
(74) Attorney, Agent, or Firm—Laurence A. Greenberg; Werner H. Stemer; Ralph E. Locher

(57) ABSTRACT

A method for filling depressions in a surface of a semiconductor structure, and a semiconductor structure filled in this way. On a semiconductor structure, in depressions on the surface, in particular below the first metal structure plane, a diffusion barrier layer is deposited, preferably with the aid of plasma-enhanced vapor phase deposition, during which the ions contained in the plasma are accelerated perpendicularly to the surface, resulting in non-conformal deposition of the diffusion barrier layer.

9 Claims, 2 Drawing Sheets

High-Frequency Generator

Heating Source

METHOD FOR FILLING DEPRESSIONS IN A SURFACE OF A SEMICONDUCTOR STRUCTURE, AND A SEMICONDUCTOR STRUCTURE FILLED IN THIS WAY

BACKGROUND OF THE INVENTION

1. Field of the Invention:

The invention relates to a method for filling depressions in a surface of a semiconductor structure, and to a semiconductor structure filled in this way.

Semiconductor structures, when utilized as integrated circuits, are produced from patterned layers arranged positionally precisely one above the other. Since the structures in these layers have a thickness in the range from 0.1 µm to 1 µm it is necessary to planarize the surface before a new structure is formed, in order to avoid steep steps for layer application. Such steep steps are disadvantageous particularly when the intention is to deposit a metal layer for interconnecting the circuit elements in the semiconductor structure. On a stepped surface, the thickness of the metallization layer at steep edges is often very small on account of the limited conformity of the sputtering coating used for applying the metal. As a result, the interconnect cross-sections become significantly smaller than on a planar surface. The current intensity then greatly increases in such narrowed interconnect regions, which can lead to rapid ageing of the interconnects. Furthermore, there is also the risk of edge tearing occurring when the interconnect runs over a step, on account of incomplete coverage of the step.

The reflow technique of doped silicate glasses is generally used for the planarization of the semiconductor structures before the implementation of the first metallization plane. In this case, the silicate glasses are principally doped with phosphorus (PSG) or with boron and phosphorus (BPSG). These glasses begin to flow at high temperatures, as a result of which even narrow depressions in the semiconductor surface can be filled. A method of this type is described e.g. in U.S. Pat. No. 5,858,848.

The doped silicate glass layers are generally fabricated by vapor phase deposition, so-called CVD deposition, on the surface. CVD deposition involves thermal decomposition of chemical compounds which, in toto, contain all of the components of the doped silicate glass layer to be produced. Depending on the supply of pressure and energy, the CVD methods are classified into atmospheric, low-pressure and plasma CVD deposition. After the application of the doped silicate glass layer, the latter is then subjected to a high-temperature step, in which the required temperature essentially depends on the phosphorus content. In the case of a temperature treatment of BPSG with a boron and phosphorus content of respectively approximately 4% at 800 to 850° C. for 20 to 30 min, depressions having a width of up to 0.15 µm and a depth/width ratio of 5:1 can be filled in a manner free from cavities.

In order to prevent the doping atoms from diffusing from the silicate glass, in particular during the high-temperature step, into the underlying semiconductor layer, a diffusion barrier layer is produced on the surface of the semiconductor structure prior to the deposition of the doped silicate glass layer. Because of its outstanding barrier effect, silicon nitride is generally used as an intermediate layer. In this case, the silicon nitride is deposited in a similar manner to the doped silicate glass in CVD reactors. In this case, the LPCVD method ("low pressure" CVD method) and the plasma-enhanced CVD method (PECVD) are preferably used as CVD process for producing silicon nitride. In the LPCVD method, the silicon nitride deposition is effected with $SiH_2Cl_2$ as a silicon source, in which a process temperature of 700° C. to 800° C. is on the semiconductor surface and a pressure of 20 to 40 Pa is in the reactor. In contrast to the LPCVD method, the PECVD nitride deposition utilizes $SiH_4$ as a silicon source, in which the process temperature is approximately 300° C. In order to be able to decompose the source gas in the PECVD method, the gas is additionally excited with the aid of a high-frequency gas discharge. The PECVD process and the LPCVD process produce a silicon nitride layer with high conformity, with the result that a layer having essentially the same thickness is produced on the entire semiconductor surface.

However, the silicon nitride layer increases the depth/width ratio of the depressions on the semiconductor surface, which are intended to be filled with the doped silicate glass in a manner free from cavities. The result of this is that in the event of further miniaturization of the semiconductor structures with widths of less than 0.15 µm, the depth/width ratio will be far in excess of the limit value of 5:1 at which the depressions of the semiconductor structures can be filled in a manner free from cavities using the known reflow technique of doped silicate glasses. Although it is possible to achieve improved flowing of the doped silicate glass layer by using temperatures of above 800° C. during the heating step, at such temperatures there is a risk that the electrical parameters of the components in the semiconductor structure will be greatly changed or that the latter will be destroyed.

SUMMARY OF THE INVENTION

It is accordingly an object of the invention to provide a semiconductor structure and a method for filling depressions in the surface of the semiconductor structure which overcomes the above-mentioned disadvantageous of the prior art apparatus and methods of this general type. In particular, it is an object of the invention to enable improved filling of depressions in the surface of a semiconductor structure, in particular below the first metal plane, which makes it possible for the depressions to be filled in a manner free from cavities even with structure widths of less than 0.15 µm and large depth/width ratios.

With the foregoing and other objects in view there is provided, in accordance with the invention a method of filling depressions on the surface of a semiconductor structure, in particular below the first metal plane. A diffusion barrier layer is produced on the semiconductor surface, preferably with the aid of plasma-enhanced vapor phase deposition, during which the ions contained in the plasma are accelerated perpendicularly toward the surface in order to build up the diffusion barrier layer. The effect thereby achieved is that the diffusion barrier layer grows primarily on the areas which run parallel to the surface, and to a lesser extent on vertical structure areas. By virtue of the invention's non-conformal deposition of the diffusion barrier layer on the semiconductor surface, the depth/width ratio is reduced for the planarization layer that is subsequently to be applied, with the result that depressions can be reliably filled even in the case of semiconductor structures having a width of less than 0.15 µm.

In accordance with an added mode of the invention, it is also possible, in particular, to utilize conventionally used silicon nitride as a diffusion barrier and to use BPSG as a planarization layer. Furthermore, oxynitride may also be used as a diffusion barrier. This means that the filling technique according to the invention can easily be integrated into the various known fabrication methods for semiconductor circuits.

In accordance with an another mode of the invention, during the vapor phase deposition for producing the diffusion barrier layer, the plasma contains at least $1*10^{10}$ ions/cm$^3$. This high plasma density makes it possible to achieve particularly high non-conformity of the deposition of the diffusion barrier layer in the depressions.

With the foregoing and other objects in view there is also provided, in accordance with the invention a semiconductor structure that includes: a substrate having a structure plane with depressions formed therein defining vertical surfaces and horizontal surfaces; a diffusion barrier layer; and a planarization layer filing the depressions. The planarization layer is disposed on the diffusion layer. The diffusion barrier layer has a layer thickness on the horizontal surfaces and a layer thickness on the vertical surfaces that is smaller than the layer thickness on the horizontal surfaces.

In accordance with an added feature of the invention, a first metallization plane is disposed above the structure plane.

In accordance with an additional feature of the invention, the diffusion barrier layer is made from silicon nitride and the planarization layer is made from doped silicate glass.

In accordance with a concomitant feature of the invention, the doped silicate glass is BPSG.

Other features which are considered as characteristic for the invention are set forth in the appended claims.

Although the invention is illustrated and described herein as embodied in a method for filling depressions in a surface of a semiconductor structure, and a semiconductor structure filled in this way, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
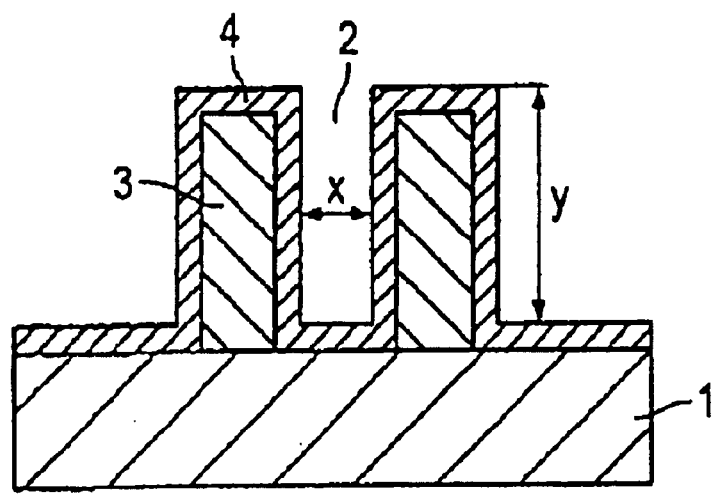
FIG. 1 shows silicon nitride deposition using a conventional LPCVD or PECVD method.

The planarization technique according to the invention serves for filling gaps and trenches on the surface of a semiconductor structure, in particular below the first metal plane. Referring now to the figures of the drawing in detail and first, particularly, to FIGS. 1–3 thereof, there is shown a cross section through such a semiconductor structure.

Semiconductor structures are principally used as integrated circuits and may be e.g. a memory module or a logic circuit. Silicon is essentially used as a material for the semiconductor structure. However, the semiconductor substrate may also be another elementary semiconductor such as e.g. germanium and also a III/V or a II/VI compound semiconductor. The integrated circuit is implemented in this semiconductor substrate in particular with the aid of the known planar technique. This includes a sequence of individual processes which each take effect over the whole area of the semiconductor surface, and which through suitable masking layers, lead to the local alteration of the semiconductor material in a targeted manner.

In general, the following processing steps are carried out with the homogeneously doped semiconductor wafer. First, an oxide layer is produced on the semiconductor wafer, then a light-sensitive resist is applied and this resist is subsequently exposed through a mask with a structure of a design plane of an integrated circuit. The resist is then developed and the exposed photoresist is removed. The oxide is subsequently etched with the photoresist as a mask layer. After the etching step, the residual photoresist is removed and then a diffusion is carried out for locally doping the semiconductor wafer with the oxide serving as a mask layer. This processing sequence is repeated a number of times in the fabrication process in order to alter the wafer doping in a locally different and targeted manner. Once all of the dopings have been introduced into the semiconductor wafer, the planar technique ends with the interconnection for producing the electrical connections. For this purpose, a metal for producing interconnects and contact points is applied over the whole area. This metal plane is subsequently patterned by an etching operation masked by photoresist. The planar technique thus makes it possible to fabricate identical structures which are continuously repeated on the wafer surface for the integration of microelectronic circuits. The structures have different dopings which are altered in a targeted manner with respect to the semiconductor substrate. In order to protect the integrated circuits and in order to provide a defined connection grid, separation of the semiconductor wafer into individual chips is followed by mounting the integrated circuits into the housings, and the electrical connection thereof.

Since the structures in the individual semiconductor layers for forming the integrated circuit have a thickness in the region of less than 1 μm, steep steps are produced during patterning. However, in order that the structured layers for forming the integrated circuit can be arranged positionally precisely one above the other, it is necessary to level this pronounced topography having steep steps. This applies particularly when an interconnection plane is to be formed. Because of the limited conformity of the sputtering coating, the thickness of the metallization layer is often very small at steep edges, as a result of which high current densities occur in these regions because of the reduced conduction cross-sections. These high current densities can lead to premature ageing of the interconnects. For this reason, it is compellingly necessary to eliminate edges or steps on the semiconductor surface prior to metallization.

Figure 2:
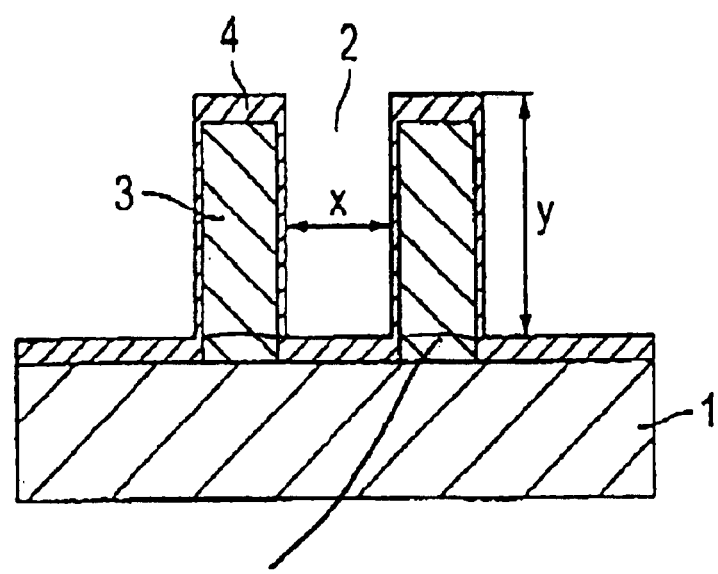
FIG. 2 shows silicon nitride deposition using the inventive method.
Figure 3:
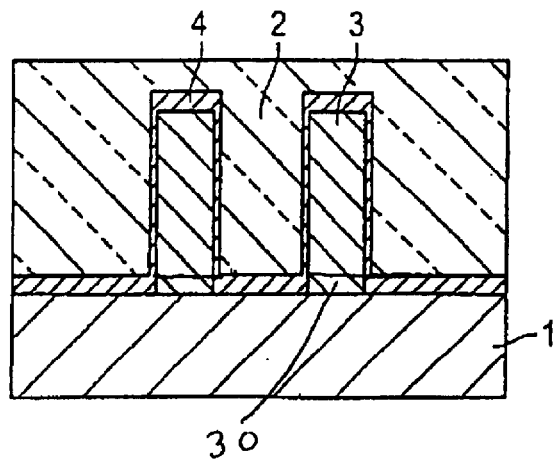
FIG. 3 shows a semiconductor structure planarized using the inventive method.

FIGS. 1 to 3 show an integrated circuit formed in a semiconductor substrate prior to the application of the first metal structure plane. In this case, the semiconductor structure 1 has deep trenches 2 principally produced as a result of the formation of the gates 3 on the semiconductor structure 1. Such gates 3 generally include a gate oxide layer 30 on which a doped polysilicon layer is arranged. The trenches 2 must be leveled prior to metallization. In this case, for leveling the surfaces, in particular below the first metal structure plane, use is made almost exclusively of the reflow technique with doped silicate glasses. These glasses are doped with phosphorus (PSG) or with boron and phosphorus (BPSG).

In this case, the doped silicate glass is generally deposited in a CVD process. After the application of the doped silicate glass, a high-temperature step is then carried out, so that the doped silicate glass is melted and the trenches 2 are thus leveled essentially in a manner free from cavities. In this case, the temperature required for the flowing of the doped silicate glass essentially depends on the phosphorus content. The BPSG preferably used has a softening point between 800° C. and 850° C.

In order to prevent the dopants in the silicate glass from penetrating into the underlying semiconductor structure during the high-temperature step, a diffusion barrier layer is deposited on the semiconductor structure before the doped glass layer is deposited. In this case, silicon nitride is principally used as the diffusion barrier layer. The silicon nitride has an outstanding barrier effect with respect to all kinds of diffusion.

The silicon nitride layers are produced in CVD reactors. In this case, the LPCVD method is principally used, in which low-pressure deposition is effected by pyrolytic decomposition of $SiH_2Cl_2$ as a silicon source and ammonia as a nitrate source. The plasma-enhanced CVD technique (PECVD) is also used as a further method for producing silicon nitride. In the PECVD technique, $SiH_4$ is provided as silicon source and is excited by a high-frequency gas discharge and decomposed, so that it reacts on the semiconductor surface even at the low temperatures of 250° C. to 350° C. that are used. These known methods produce a silicon nitride layer 4 distinguished by high conformity, as shown in FIG. 1.

This essentially uniform silicon deposition both on the horizontal and on the vertical surface regions means that the depth/width ratio y:x of the trenches 2 on the semiconductor surface increases as a result of the silicon nitride layer. However, with the conventional reflow technique with doped silicate glasses, in which a temperature of less than 900° C. is used in the high-temperature step in order to prevent damage to the semiconductor structure, it is only possible for trenches having a depth/width ratio of at most 5:1 to be filled in a manner free from cavities. For this reason, only semiconductor structures having a width of greater than 0.15 µm can be reliably planarized using the conventional technique in which a conformal silicon nitride diffusion barrier layer is provided.

Semiconductor structures having widths of less than 0.15 µm are emerging on account of the progressive miniaturization of integrated circuits. In order to be able to fill trenches in a manner free from cavities even in the case of these semiconductor structures having smaller widths, the present method enables the silicon nitride diffusion barrier layer to be deposited on the semiconductor structure in such a way that the deposition rate on horizontal surfaces is significantly higher than that on vertical surfaces. The effect thereby achieved, as shown in FIG. 2, is that the layer thickness of the silicon nitride layer 4 is smaller on the side walls of the trench 2 than on the bottom and end areas, with the result that the depth/width ratio y:x is smaller than in the case of a silicon nitride layer deposited using the conventional technique.

On the silicon nitride layer 4 having reduced side wall thickness in the trenches 2, it is then also possible to apply silicate glasses which are doped using the conventional reflow technique and which fill the trenches 2 in a manner free from cavities, as is shown in FIG. 3. It is then also possible, in particular, to achieve cavity-free planarization of the semiconductor structure, in particular below the first metallization plane, in the case of semiconductor structures having a width of less than 0.15 µm.

In order to achieve the non-conformal deposition of the silicon nitride layer 4 in the trenches 2 of the semiconductor structure 1, the silicon nitride layer 4 is deposited on the semiconductor structure surface with the aid of a plasma-enhanced CVD method in which $N_2$ is used as a nitride source and $SiH_4$ is used as a silicon source. In this case, the $N^+$ and $SiH_x^+$ ions contained in the plasma are accelerated perpendicularly toward the surface of the semiconductor structure 1, so that layer growth takes place primarily on those areas which run horizontally with respect to the semiconductor surface. On vertically oriented surfaces, by contrast, the layer growth is reduced, with the result that non-conformal layer growth takes place. In this case, the production of silicon nitride is preferably carried out in a CVD reactor with a high plasma density of in excess of $1*10^{10}$ ions/cm$^3$.

Figure 4:
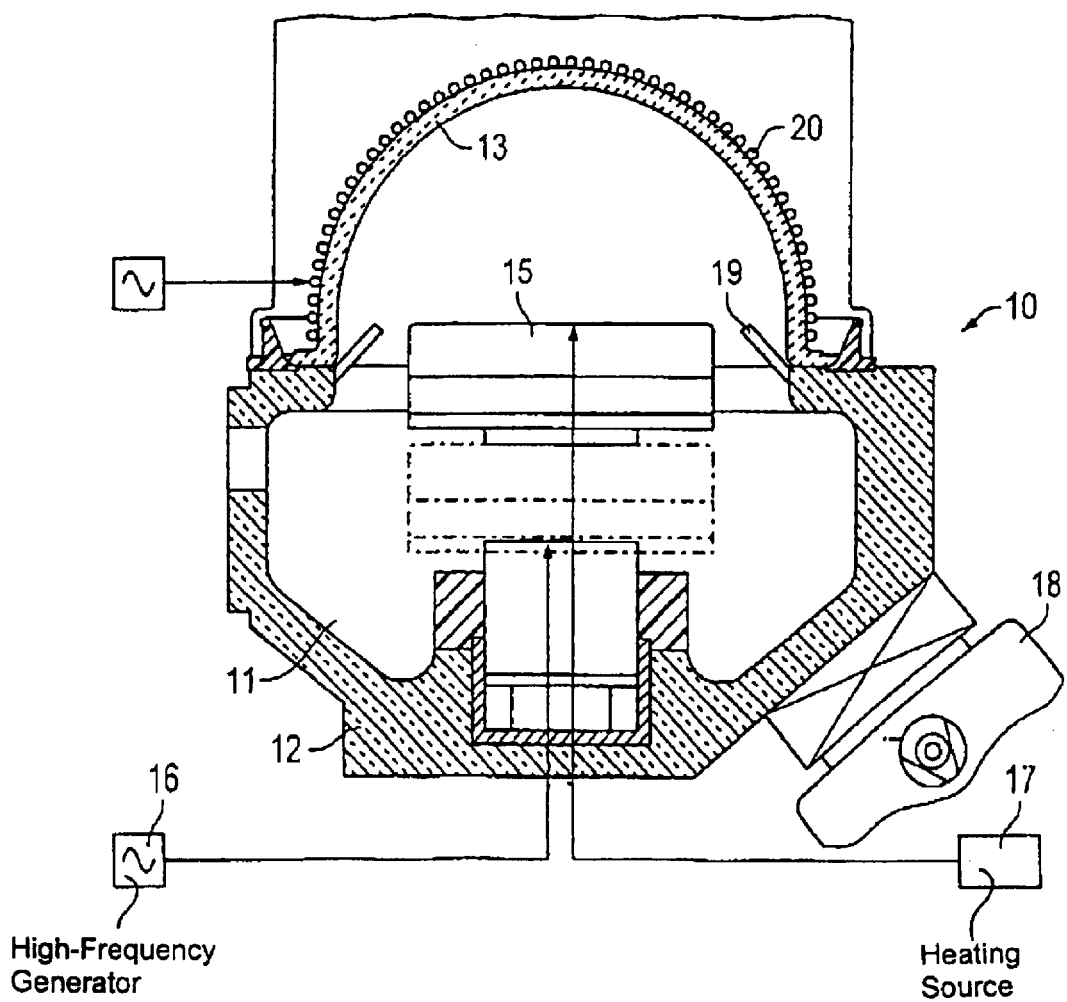
FIG. 4 shows a CVD reactor for carrying out the inventive method.

FIG. 4 shows a CVD reactor which can be used to carry out such a so-called HDP (high density plasma) method. Such reactors are offered by the company Novellus. Such an HDP-CVD reactor 10 has, as shown in FIG. 4, a process chamber 11 assembled from a trough-shaped bottom element 12, which is composed of a highly conductive material, and a ceramic dome 13 placed on top. In the process chamber 11, a bipolar electrostatic chuck 15 is arranged in the transition region between the bottom element 12 and the dome 13. The semiconductor structure 1, for the deposition of the silicon nitride layer 4, is fixedly held on the the chuck 15 with the aid of an electrostatic holding force. This electrostatic force is supplied by a high-frequency generator 16, which applies an alternating voltage with low current to the chuck 15 and thus to the semiconductor wafer at a frequency of preferably 13.56 MHz.

The electrostatic chuck 15 is furthermore connected to a heating source 17 in order to achieve, on the surface of the semiconductor structure 1, the desired reaction temperature for producing the silicon nitride. Furthermore, a pump arrangement 18 is connected to the bottom element 12. The pump arrangement produces a low pressure of less than 5 mTorr in the process chamber 11. At the same time, the gases required for producing the silicon nitride are fed through lateral inlets 19 in the transition region between the bottom element 12 and the dome 13. $SiH_4$, $N_2$ and $H_2$ are fed in for this purpose. Ar may be fed in in order to improve the sputtering effect.

The gas discharge in the reactor is generated by inductively coupling in a high-frequency field at a frequency of 300 to 400 kHz via a copper coil 20 wound around the dome 13. In this case, the dome shape ensures a highly uniform ion density in the region of the surface of the semiconductor structure 1, with the result that the silicon nitride deposition can be effected even over a large semiconductor surface.

The alternating voltage applied by the HF generator 16 for fixedly holding the semiconductor structure 1 on the chuck 15 generates a bias voltage on the semiconductor surface, which bias voltage accelerates the ions present in the plasma toward the surface, in particular the $N^+$ and the $SiH_x^+$ ions. The effect thereby achieved is that the silicon nitride layer 4 is deposited non-conformally on the semiconductor surface. In the case of non-conformal silicon nitride deposition, the following parameters have proved to be advantageous in the case of the HDP/CVD reactor 10 shown in FIG. 4:

| Parameter | Unit | Magnitude |
|---|---|---|
| LF | watt | 4500 |
| $H_2$ | sccm | 400 |
| LFdp | watt | 1950 |
| Ar | sccm | 300 |
| $N_2$ | sccm | 400 |
| $SiH_4$ | sccm | 40 |
| SDT | sec | 29 (70 nm) | where LF and LFdp represents the power before and during the gas discharge, and where SDT corresponds to the deposition time. The deposition of the doped silicate glass which is carried out after the production of the silicon nitride layer as a diffusion barrier layer can likewise be effected using the reactor shown in FIG. 4.

Furthermore, it is also possible to use a different diffusion barrier layer, e.g. oxynitride, instead of the silicon nitride layer. What is crucial is the non-conformal deposition of the diffusion barrier layer, so that reduced growth takes place on the vertical surfaces of the semiconductor structure, as a result of which a smaller depth/width ratio y:x of the depressions is achieved.

The features of the invention which are disclosed in the above description, the drawing, and the claims may be of importance both individually and in any desired combination for the realization of the invention in its various configurations.

I claim:

1. A method for filling depressions, which comprises:
   providing a semiconductor substrate having a given surface and semiconductor components disposed on the given surface, spaces between the semiconductor components defining the depressions to be filled, the depressions extending to the given surface of the semiconductor substrate;
   performing plasma-enhanced vapor phase deposition by accelerating ions contained in the plasma perpendicularly toward the given surface of the semiconductor substrate to build up a silicon nitride diffusion barrier layer on top surfaces of the semiconductor components, on sidewalls of the depressions, and on bottom areas of the depressions such that a thickness of the diffusion barrier layer is smaller on the sidewalls of the depressions than on the bottom areas of the depressions; and
   depositing a reflowable material and reflowing the material to form a planarization layer to fill the depressions.

2. The method according to claim 1, which comprises:
   producing the diffusion barrier layer from a material selected from the group consisting of silicon nitride and oxynitride; and
   producing the planarization layer from a doped silicate glass.

3. The method according to claim 2, which comprises providing the doped silicate glass as BPSG.

4. The method according to claim 1, which comprises, while building up the diffusion barrier layer, providing the plasma with at least $1*10^{10}$ ions/cm$^3$.

5. The method according to claim 1, which comprises providing the semiconductor components forming the depressions before producing a first metal plane.

6. The method according to claim 1, wherein: the semiconductor components are gates each having a gate oxide on which a doped polysilicon layer is configured.

7. The method according to claim 1, which comprises, while building up the diffusion barrier layer, providing the plasma with at least $1*10^{10}$ ions/cm$^3$ in a chamber having a pressure of less than 5 mTorr.

8. The method according to claim 1, which comprises, while building up the diffusion barrier layer, providing the plasma with at least $1*10^{10}$ ions/cm$^3$ in a chamber having a pressure of less than 5 mTorr, and inductively coupling in a high-frequency field at a frequency of 300 to 400 KHz.

9. The method according to claim 1, which comprises:
   providing each of the semiconductor components with a gate having a gate oxide on which a doped polysilicon layer is configured; and
   while building up the diffusion barrier layer, providing the plasma with at least $1*10^{10}$ ions/cm$^3$ in a chamber having a pressure of less than 5 mTorr, and inductively coupling in a high-frequency field at a frequency of 300 to 400 KHz.

* * * * *